(12) United States Patent
Wu et al.

(10) Patent No.: US 7,994,495 B2
(45) Date of Patent: Aug. 9, 2011

(54) ORGANIC THIN FILM TRANSISTORS

(75) Inventors: Yiliang Wu, Mississauga (CA); Beng S. Ong, Singapore (CN)

(73) Assignee: Xerox Corporation, Norwalk, CT (US)

( * ) Notice: Subject to any disclaimer, the term of this patent is extended or adjusted under 35 U.S.C. 154(b) by 619 days.

(21) Appl. No.: 12/014,884

(22) Filed: Jan. 16, 2008

(65) Prior Publication Data
US 2009/0179194 A1    Jul. 16, 2009

(51) Int. Cl.
*H01L 51/30* (2006.01)
(52) U.S. Cl. .................... 257/40; 257/411; 257/E51.007
(58) Field of Classification Search .................... 257/40, 257/E51.001–E51.052, 410–411; 438/99
See application file for complete search history.

(56) References Cited

U.S. PATENT DOCUMENTS

| | | | | |
|---|---|---|---|---|
| 4,269,682 A | * | 5/1981 | Yano et al. ................... | 204/418 |
| 6,586,791 B1 | * | 7/2003 | Lee et al. ..................... | 257/295 |
| 7,029,945 B2 | * | 4/2006 | Veres et al. .................. | 438/99 |
| 2003/0158371 A1 | * | 8/2003 | Akamine et al. ............. | 528/196 |
| 2004/0222412 A1 | * | 11/2004 | Bai et al. ..................... | 257/40 |
| 2006/0231908 A1 | | 10/2006 | Liu et al. | |
| 2006/0234430 A1 | | 10/2006 | Liu et al. | |
| 2006/0284166 A1 | * | 12/2006 | Chua et al. .................. | 257/40 |
| 2007/0075308 A1 | | 4/2007 | Dotz et al. | |
| 2009/0267057 A1 | * | 10/2009 | Setayesh et al. ............. | 257/40 |

FOREIGN PATENT DOCUMENTS

WO    WO 2004022620 A1 *  3/2004

OTHER PUBLICATIONS

Khandpur, A.K., et al. Macromol., vol. 28 (1995): pp. 8796-8806.*
McCulloch, I., et al. Nat. Mater,. vol. 5 (2006): pp. 328-333.*
Bourgeat-Lami, E. & Lang, J. J. Colloid & Int. Sci., vol. 197 (1998): pp. 293-308.*

* cited by examiner

*Primary Examiner* — Matthew W Such
(74) *Attorney, Agent, or Firm* — Fay Sharpe LLP

(57) ABSTRACT

An organic thin film transistor has a gate dielectric layer which is formed from a block copolymer. The block copolymer comprises a polar block and a nonpolar block. The resulting dielectric layer has good adhesion to the gate electrode and good compatibility with the semiconducting layer.

12 Claims, 3 Drawing Sheets

ORGANIC THIN FILM TRANSISTORS

CROSS-REFERENCE TO RELATED APPLICATIONS

This application is related to U.S. patent application Ser. No. 11/695,131, filed Apr. 2, 2007, and titled "PHASE-SEPARATED DIELECTRIC STRUCTURE FABRICATION PROCESS". That application is hereby fully incorporated by reference herein.

BACKGROUND

The present disclosure relates, in various embodiments, to thin-film transistors (TFTs) comprising a semiconducting layer and a gate dielectric layer comprising a block copolymer. The block copolymer comprises a polar block and a nonpolar block. The resulting dielectric layer has good adhesion to gate electrode of the TFTs and good compatibility with the semiconducting layer. Methods for making and using the same are also disclosed.

There is interest in organic thin film transistors (OTFTs) for applications such as radio frequency identification (RFID) tags and backplane switching circuits for displays, such as signage, readers, and liquid crystal displays, where high switching speeds and/or high density are not essential. OTFTs may be made using low-cost solution or liquid fabrication techniques. They also have attractive mechanical properties such as being physically compact, lightweight, and flexible.

OTFTs are generally composed of, on a substrate, an electrically conductive gate electrode, source and drain electrodes, an electrically insulating gate dielectric layer which separate the gate electrode from the source and drain electrodes, and a semiconducting layer which is in contact with the gate dielectric layer and bridges the source and drain electrodes. Their performance can be determined by the field effect mobility and the current on/off ratio. High mobility and high on/off ratio are desired.

Materials useful in electrically insulating gate dielectric layers should have low leakage current, good adhesion to the gate electrode, good compatibility with the semiconducting layer, etc.

BRIEF DESCRIPTION

The present application discloses, in various exemplary embodiments, organic thin film transistors. The dielectric layer of these organic thin film transistors comprises a block copolymer, wherein the block copolymer comprises a polar block and a nonpolar block.

In some embodiments, an organic thin film transistor comprises a substrate, a semiconductor layer, and a gate dielectric layer, the gate dielectric layer comprising a block copolymer, wherein the block copolymer comprises a polar block and a nonpolar block.

The polar block may be selected from the group consisting of polyacrylates, polyamides, polyesters, polyethers, polyvinyl alcohol, polyacrylonitriles, polycarbonates, polyketones, polysulfones, polyvinyl phenol, and polyimides.

The nonpolar block may be selected from the group consisting of polyethylene, polypropylene, polyalkylsilanes, polystyrenes, polysiloxanes, polyphenylenes, poly(1,3-butadiene), polyisoprenes, and polyisobutylene.

The polar block may be bisphenol-A and the nonpolar block may be polydimethysilane.

The gate dielectric layer may be in the form of a first layer comprising a majority of the polar block of the block copolymer and a second layer comprising a majority of the nonpolar block of the block copolymer, wherein the second layer is closer to the semiconductor layer than the first layer. The first layer may alternatively comprise from about 60% to 100% by weight of the polar block, based on the total weight of the first layer. The second layer may alternatively comprise from about 60% to 100% by weight of the nonpolar block, based on the total weight of in the second layer.

The dielectric constant of the first layer may be greater than the dielectric constant of the second layer. Alternatively, the difference between the dielectric constant of the first layer and the dielectric constant of the second layer may be at least about 1.0. The polar block may have a dielectric constant of 4.0 or greater. The nonpolar block may have a dielectric constant of 3.5 or less. The overall dielectric constant of the block copolymer may be 4.0 or greater.

The gate dielectric layer may be phase-separated into (i) a continuous phase comprising a majority of the nonpolar block of the block copolymer; and (ii) a discontinuous phase comprising a majority of the polar block of the block copolymer.

The block copolymer may be a diblock copolymer. The block copolymer may also be crosslinked.

The polar block may comprise a polar chemical group selected from the group consisting of —CN, —NO$_2$, —OH, —COO—, —CO—, —CONH—, —Cl, —F, and SO$_2$.

The nonpolar block may be selected from the group consisting of polydimethyl siloxane, poly(α-methyl styrene), and polyethylene.

The block copolymer may be selected from the group consisting of polyimide-b-polysiloxane, poly(4-vinyl pryridine)-b-polystyrene, polyester-b-polysiloxane, poly(ethylene oxide)-b-polystyrene, poly(methyl methacrylate)-b-polystyrene, polyacrylonitrile-b-poly(1,3-butadiene), poly(2-hydroxyethyl methacrylate)-b-polystyrene, poly(4-vinyl phenol)-b-polysiloxane, poly(vinyl alcohol)-b-poly(dimethyl siloxane), poly(ethylene oxide)-b-polyisoprene, and polyamide-b-polyether. The block copolymer may also be crosslinked.

The dielectric layer may further comprise inorganic nanoparticles, wherein a majority of the nanoparticles is dispersed in a phase formed from the polar block. The inorganic nanoparticles may be formed in-situ in the presence of the block copolymer.

The transistor may further comprise a semiconducting layer which may comprise a polythiophene. In some embodiments, the polythiophene has one of the three following structures:

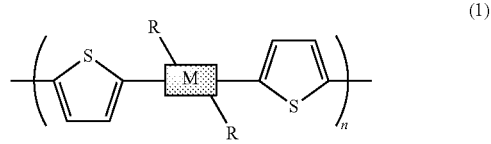

(1)

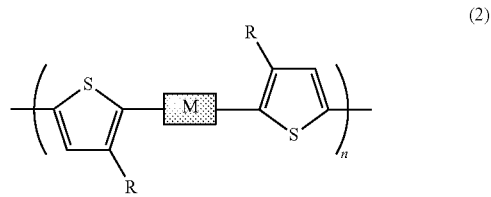

(2)

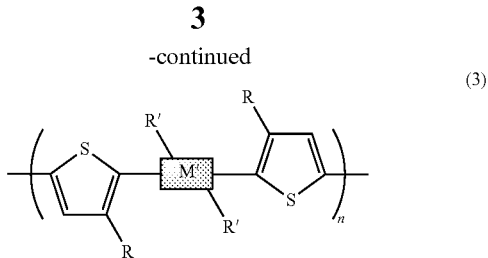

(3)

where R and R' are independently selected from hydrogen, halogen, alkyl, alkoxyalkyl, siloxyalkyl, and perfluoroalkyl; M is a divalent linkage; and n is the degree of polymerization.

In other embodiments, a method of forming a phase-separated gate dielectric layer is disclosed, comprising:
providing a substrate and a block copolymer, the block copolymer comprising a polar block and a nonpolar block;
forming micelles of the block copolymer in a solution wherein the polar block self-assembles into a core of each micelle and the nonpolar block self-assembles into a shell of each micelle; and
depositing the solution comprising the micelles upon the substrate.

In still other embodiments, a method of forming a dual-layer gate dielectric layer is disclosed, comprising:
providing substrate and a block copolymer, the block copolymer comprising a polar block and a nonpolar block; and
depositing the block copolymer upon the substrate, wherein the block copolymer self-assembles into a first layer formed from the polar block and a second layer formed from the nonpolar block.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

Figure 1:
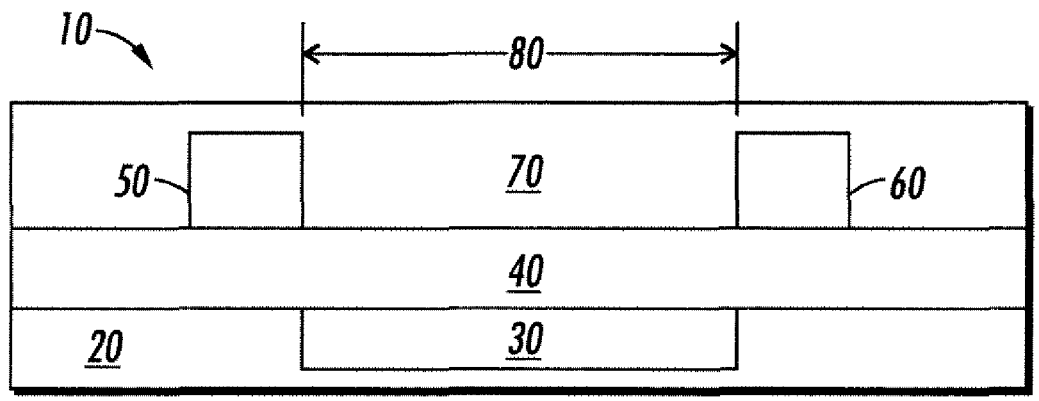
FIG. 1 represents a first embodiment of a TFT according to the present disclosure.

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

FIG. 1 illustrates a bottom-gate bottom-contact TFT configuration according to the present disclosure. The TFT 10 comprises a substrate 20 in contact with the gate electrode 30 and a gate dielectric layer 40. Although here the gate electrode 30 is depicted within the substrate 20, this is not required. However, it is important that the gate dielectric layer 40 separates the gate electrode 30 from the source electrode 50, drain electrode 60, and the semiconducting layer 70. The semiconducting layer 70 runs over and between the source and drain electrodes 50 and 60. The semiconductor has a channel length 80 between the source and drain electrodes 50 and 60.

Figure 2:
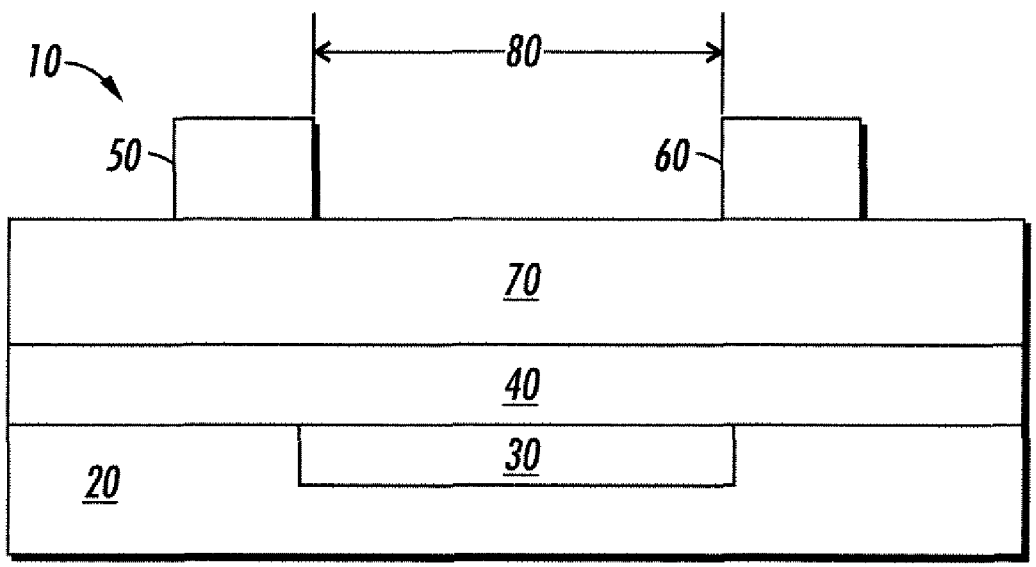
FIG. 2 represents a second embodiment of a TFT according to the present disclosure.

FIG. 2 illustrates another bottom-gate top-contact TFT configuration according to the present disclosure. The TFT 10 comprises a substrate 20 in contact with the gate electrode 30 and a gate dielectric layer 40. The semiconducting layer 70 is placed on top of the gate dielectric layer 40 and separates it from the source and drain electrodes 50 and 60.

Figure 3:
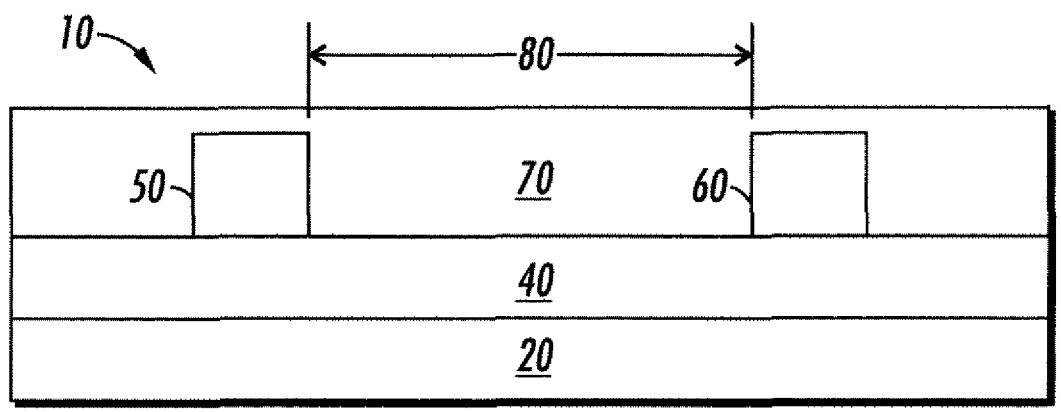
FIG. 3 represents a third embodiment of a TFT according to the present disclosure.

FIG. 3 illustrates a bottom-gate bottom-contact TFT configuration according to the present disclosure. The TFT 10 comprises a substrate 20 which also acts as the gate electrode and is in contact with a gate dielectric layer 40. The source electrode 50, drain electrode 60, and semiconducting layer 70 are located atop the gate dielectric layer 50.

Figure 4:
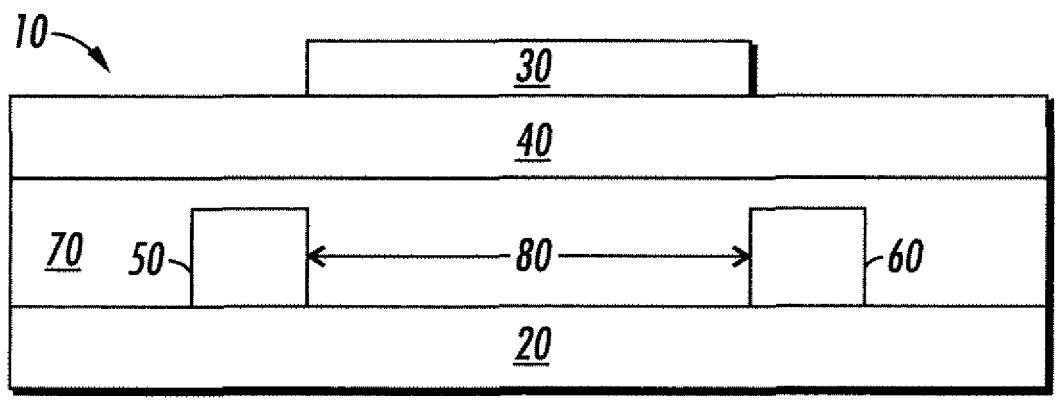
FIG. 4 represents a fourth embodiment of a TFT according to the present disclosure.

FIG. 4 illustrates a top-gate top-contact TFT configuration according to the present disclosure. The TFT 10 comprises a substrate 20 in contact with the source electrode 50, drain electrode 60, and the semiconducting layer 70. The semiconducting layer 70 runs over and between the source and drain electrodes 50 and 60. The gate dielectric layer 40 is on top of the semiconducting layer 70. The gate electrode 30 is on top of the gate dielectric layer 40 and does not contact the semiconducting layer 70.

The dielectric layer of the present disclosure comprises a block copolymer. The block copolymer comprises a polar block and a nonpolar block. The polar block is generally hydrophilic, while the nonpolar block is generally hydrophobic. The block copolymer generally has a structure similar to that shown in Structure (1A):

Structure (1A)

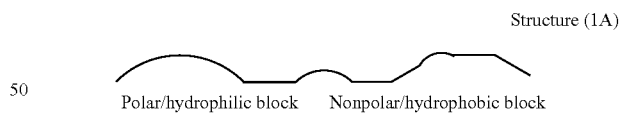

Polar/hydrophilic block    Nonpolar/hydrophobic block

Structure 1A is depicted as a diblock copolymer. However, in embodiments, the block copolymer may be a di-block copolymer (such as A-B), a tri-block copolymer (such as A-B-A, A-B-C, or B-A-B) wherein the copolymer can have two polar blocks which are the same or different from each other, or two nonpolar blocks which are the same or different from each other, or a multiblock copolymer (such as A-B-A-B, A-B-A-B-A, B-A-B-A-B-A-B, A-B-A-B-C, C-A-B-A-C, and the like) wherein the copolymer could have multiple polar blocks and multiple nonpolar blocks which are the same or different from each other, wherein A represents the polar block, B represents the nonpolar block, and C represents either a polar or a nonpolar block which is different from A and B. In embodiments, the ratio of the number of polar blocks to the number of nonpolar blocks may be from about 9:1 to about 1:9, preferably from about 3:1 to about 1:3. In further embodiments, the block copolymer is a diblock copolymer (the ratio is 1:1). In embodiments, the block copolymer is a linear polymer as depicted as Structure 1A. In other embodiments, the block copolymer is a star-shaped block copolymer.

The block copolymer, when deposited as a thin film, generally self-assembles into different microstructures or microdomains depending on the molecular weight and block length of each block. The size scale of the domains is governed by the chain dimensions of the copolymer, while the block ratio determines the mesophase structure of the block copolymer film. For example, a diblock copolymer can form spheres, cylinders, gyroid, and lamellae mesophase structures. In embodiments, spheres, cylinders, or lamellar structures are formed. In further embodiments, the block copolymer self-assembles into a lamellar structure, namely a layered structure, such as a two layer structure where one layer is a majority of the polar blocks and the other layer is a majority of the nonpolar blocks. More particularly, one layer may contain from about 60% to 100% by weight of polar blocks and one layer may contain from about 60% to 100% by weight of nonpolar blocks, based on the total weight of each layer. It is believed that a low energy copolymer surface directs the copolymer to self-assemble into a bilayer structure. The polar block, which has a high surface energy, generally adheres well with the gate electrode, which is generally an inorganic material, such as metal. The nonpolar block, which has a low surface energy, generally interacts well with the semiconducting layer to induce a preferred orientation in the semiconducting layer and to reduce interface trapping in the semiconducting layer. For example, polythiophene semiconducting polymers interact well with hydrophobic surfaces. These effects optimize performance in the semiconducting layer.

Figure 5:
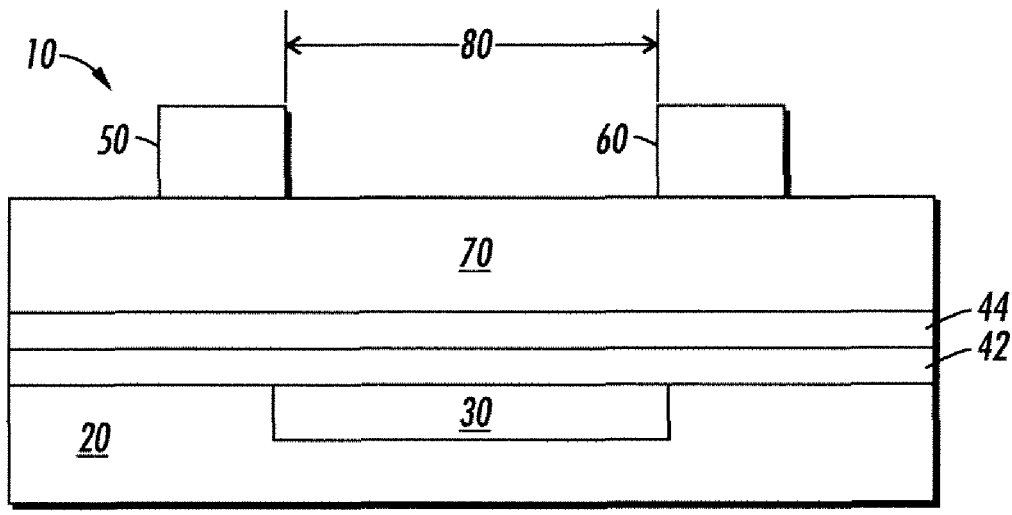
FIG. 5 shows one embodiment of a dielectric layer according to the present disclosure.

The block copolymer shown in FIG. 5 has formed a two-layer lamellar structure. As seen there, the polar layer 42 (containing a majority of the polar block) contacts the gate electrode (here, the substrate 20 also acts as the gate electrode) and the nonpolar layer 44 (containing a majority of the nonpolar block) contacts the semiconducting layer 70.

In further embodiments, the block copolymer is phase-separated into a discontinuous phase, such as spherical or cylindrical mesophase structures, dispersed in a continuous phase. When the block copolymer forms spherical or cylindrical structures, the discontinuous phase is preferably formed from the polar block, while the continuous phase is preferably formed from the nonpolar phase.

Figure 6:
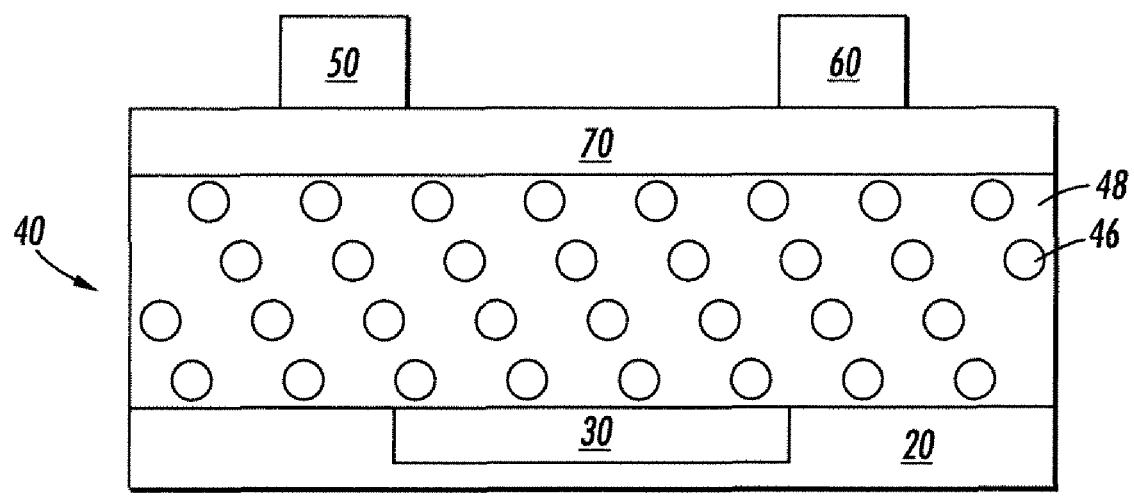
FIG. 6 shows another embodiment of a dielectric layer according to the present disclosure.

For example, in FIG. 6, the dielectric layer 40 is formed from block copolymer in the form of spherical mesophase structures in a continuous phase, wherein a discontinuous phase is in the form of spheres 46 are formed from polar blocks and the continuous phase 48 is formed from the nonpolar blocks. Such a dielectric layer can be formed from micelles having a core and a shell, the core being formed from the discontinuous phase and the shell being formed from the continuous phase. The shells are then fused to form continuous phase 48 and the cores become spheres 46.

The polar block generally has a high dielectric constant. The nonpolar block has a lower dielectric constant compared to the polar block. In embodiments, the polar block has a dielectric constant of 4.0 or greater, about 5.0 or greater, or about 6.0 or greater. The nonpolar block has a dielectric constant of less than 4.0, 3.5 or less, or 3.0 or less. In embodiments, the difference in dielectric constant between the polar and nonpolar blocks is at least about 0.5. In other embodiments, the difference is at least about 1.0, or at least about 2.0.

The dielectric constant of the polar and nonpolar block can be determined separately using a homopolymer of the polar block and a homopolymer of the nonpolar block, respectively. The block copolymer has an overall dielectric constant of about 3.5 or greater, about 4.0 or greater, or about 6.0 or greater. The overall dielectric constant can be adjusted by using different polar and nonpolar blocks or by using different ratios of polar to nonpolar block length. This structure and difference in the properties of the two blocks is desirable. Materials with high dielectric constant are preferred as gate dielectrics for organic thin film transistors because they may enable devices to be operated at a low voltage.

The polar block may comprise a repeating unit selected from the group consisting of polyacrylates, polyamides, polyesters, polyethers, polyvinyl alcohol, polyacrylonitriles, polycarbonates, polyketones, polysulfones, polyvinyl phenol, polyimides, and the like. Generally speaking, the repeating unit of the polar block comprises polar chemical groups such as —CN, —NO$_2$, —OH, —COO—, —CO—, —CONH—, —Cl, —F, and —SO$_2$. In embodiments, the repeating unit of the polar block comprises a donor-acceptor type moiety which has an electron donor group such as —O—, —NH$_2$—, —NH—, —S—, and the like and a electron acceptor group such as —CN, —NO$_2$, —CO—, and the like to give a large dipolar moment. The donor-acceptor moiety has a dipolar moment of at least 2, at least 4, or at least 6. If desired, the polar block may have more than one repeating unit. In addition, the polar blocks making up the block copolymer may vary as to their repeating unit.

The nonpolar block may comprise a repeating unit selected from the group consisting of polyethylene, polypropylene, polyalkylsilanes, polystyrenes, polysiloxanes, polyphenylenes, poly(1,3-butadiene), polyisoprenes, polyisobutylene, and the like. Generally speaking, the repeating unit of the nonpolar block comprises mostly hydrocarbon groups, Si groups, or SiO groups. These groups have no or very small dipolar moment such as, for example, less than 2. If desired, the nonpolar block may have more than one repeating unit. In addition, the nonpolar blocks making up the block copolymer may vary as to their repeating unit.

In embodiments, the nonpolar block is polysiloxane, such as polydimethyl siloxane. The polar block of the block copolymer can be, for example polyimide, poly(vinyl phenol), poly(vinyl alcohol), polyester, polyurethane, polyacrylate, polymethylacrylate, or epoxy. When cast into a film, the polysiloxane block will migrate to the surface of the film, because polysiloxane has a low surface energy.

In other embodiments, the nonpolar block is polystyrene, such as poly(α-methyl styrene). The polar block of the block copolymer can be the same as the above, Exemplary polar blocks include poly(2-hydroxyethyl methacrylate) (HEMA), polyacrylic acid, polypyridine, polyvinyl alcohol), polyvinyl phenol, and the like.

In yet other embodiments, the nonpolar block is polyethylene.

In embodiments, the block copolymer may be selected from the group consisting of: polyimide-b-polysiloxane, poly(4-vinyl pryridine)-b-polystyrene, polyester-b-polysiloxane, poly(ethylene oxide)-b-polystyrene, poly(methyl methacrylate)-b-polystyrene, polyacrylonitrile-b-poly(1,3-butadiene), poly(2-hydroxyethyl methacrylate)-b-polystyrene, poly(4-vinyl phenol)-b-polysiloxane, poly(vinyl alcohol)-b-poly(dimethyl siloxane), poly(ethylene oxide)-b-polyisoprene, and polyamide-b-polyether.

One test for distinguishing between polar and nonpolar materials is by measuring the advancing water contact angle, which measures the surface energy, of a thin film of the material. A polar block will have a contact angle of less than 80 degrees, while a nonpolar block will have a contact angle of 80 degrees or greater.

The block copolymer can be prepared by any suitable method. For example, the block copolymer can be prepared by living polymerization methods such as atom transfer radical polymerization (ATRP). The block copolymer can also be prepared by graftingor by using macromolecular initiators.

The lengths of the polar and nonpolar blocks may differ. In embodiments, the ratio of the length of the polar block to the length of the nonpolar block may be from about 19:1 to about 1:19. In further embodiments, the ratio is from about 19:1 to about 1:1. Generally, it is preferred to have a longer polar block.

In embodiments, the block copolymer can be blended with another homopolymer for gate dielectric application. The chemical structure of the homopolymer can be different from any block of the block copolymer, or the same as one block of the block copolymer. In embodiments, the chemical structure of the homopolymer is the same as the polar block of the block copolymer. In such a blend, the homopolymer may improve the dielectric constant of the gate dielectric while the block copolymer provides a functional surface for the gate dielectric layer. The use of the block copolymer has advantages over previous self-assembled monolayers (SAM). First, SAM is not particularly useful for the modification of soft or polymeric surfaces. Block copolymers can be mixed with other gate dielectric materials to modify soft or polymeric surfaces to achieve required surface properties. The block copolymer itself can also be used to form the gate dielectric layer with proper functional surface properties. Second, the block copolymer provides functional surface via self assembly. No complicated surface modification process is needed to fabricate the device. Third, using the block copolymer, it is easy to control the density and distribution of surface functional groups. In case of SAM, mixed materials must be used, which can lead to inhomogeneous spatial distribution of the functional groups.

In embodiments, the block copolymer self-assembles into the desired mesophase structure during deposition and drying of the solvent. In other embodiments, the block copolymer self-assembles in a solution prior to deposition. After deposition onto a substrate, self-assembly or phase-separation of the block copolymer can also be achieved, for example by solvent annealing or thermal annealing. For thermal annealing, the deposited layer is heated to an elevated temperature, particularly a temperature above the glass transition temperature of one block of the block copolymer. For solvent annealing, the deposited layer is exposed to the vapor of a solvent, particularly a good solvent for one block of the block copolymer.

The block copolymer can form micelles in solution when the proper solvent or solvents are used. In embodiments, the polar block self-assembles into the core of the micelles and the nonpolar block self-assembles into shell of the micelles. This may help the self-assembly of the block copolymer into various mesophase structures, particularly the spherical phase structure. When deposited onto a substrate, the shell of the micelles collapse together to form a continuous phase, while the core of the micelles collapse to form spherical phase dispersed in the continuous phase. In embodiment, the micelles have a size of from about 5 nanometers to about 500 nanometers, or from about 10 nanometers to about 300 nanometers.

In further embodiments, the block copolymer is crosslinked as well. In embodiments, crosslinking occurs only at the polar block or only at the nonpolar block. In other embodiments, the crosslinking takes place at both the polar block and the nonpolar block.

In further embodiments, the gate dielectric layer further comprises inorganic particles such as nanoparticles. The nanoparticles have a particle size of from about 3 nm to about 500 nm, or from about 3 nm to about 100 nm. Any suitable inorganic nanoparticles can be used. Exemplary nanoparticles include metal nanoparticles such as Au, Ag, Cu, Cr, Ni, Pt and Pd; metal oxide nanoparticles such as $Al_2O_3$, $TiO_2$, $ZrO_2$, $La_2O_3$, $Y_2O_3$, $Ta_2O_5$, $ZrSiO_4$, SrO, SiO, $SiO_2$, MgO, CaO, $HfSiO_4$, $BaTiO_3$, and $HfO_2$; and other inorganic nanoparticles such as ZnS and $Si_3N_4$. The addition of inorganic nanoparticles has several advantages. First, the dielectric constant of the overall dielectric can be improved. Second, when metal nanoparticles are added, the particles can function as electron traps to lower gate leakage of the gate dielectric layer. The inorganic nanoparticles can be from about 0.1% to about 50% or from about 1% to about 20% by weight of the gate dielectric layer.

The inorganic particles can be added by mixing a solution of the block copolymer and a dispersion of the inorganic particles. The inorganic particles can also be added by in-situ formation of inorganic particles in the presence of the block copolymer. The block copolymer can function as a stabilizer for the formation of the inorganic particles. For example, $TiO_2$ nanoparticles can be formed in a micelle solution of poly(styrene)-b-poly(4-vinyl pyridine) block copolymer by hydrolysis of $TiCl_4$. $TiO_2$ will form inside the micelles with the polar block poly(4-vinyl pyridine) as stabilizer bonded to the surface of the nanoparticles. Similarly, metal nanoparticles such as gold nanoparticles can be formed by reduction of $HAuCl_4$. In embodiments, the nanoparticles are homogeneously dispersed throughout the block copolymer. In other embodiments, the nanoparticles are preferentially dispersed in the polar phase.

The total thickness of the gate dielectric layer can be, for example, from about 5 nanometers to about 5000 nanometers, including from about 100 to about 1000 nanometers. The gate dielectric layer may have a conductivity that is, for example, less than about $10^{-12}$ Siemens per centimeter (S/cm).

The gate dielectric layer is formed using conventional processes known in the art. In embodiment, the gate dielectric layer is formed using liquid depositing techniques. In other words, a dielectric composition comprising the block copolymer is liquid deposited onto a substrate. Any suitable liquid depositing technique may be employed. Exemplary liquid depositing techniques include blanket coating such as spin coating, blade coating, rod coating, dip coating, and the like, and printing such as screen printing, ink jet printing, stamping, stencil printing, screen printing, gravure printing, flexography printing, and the like. Another advantage of the present disclosure is that forming a bilayer dielectric layer from the instant block copolymer requires fewer processing steps than forming two dielectric layers separately.

In embodiments, the semiconductor layer is in direct contact with the mesophase structure comprising a majority of the nonpolar block. In other embodiments, the mesophase structure comprising a majority of the nonpolar block is closer to the semiconductor layer than the mesophase structure comprising a majority of the polar block.

The substrate may be composed of materials including but not limited to silicon, glass plate, plastic film or sheet. For structurally flexible devices, plastic substrate, such as for example polyester, polycarbonate, polyimide sheets and the like may be preferred. The thickness of the substrate may be from about 10 micrometers to over 10 millimeters with an exemplary thickness being from about 50 to about 100 micrometers, especially for a flexible plastic substrate and from about 0.5 to about 10 millimeters for a rigid substrate such as glass or silicon.

The gate electrode is composed of an electrically conductive material. It can be a thin metal film, a conducting polymer film, a conducting film made from conducting ink or paste, or the substrate itself, for example heavily doped silicon. Examples of gate electrode materials include but are not restricted to aluminum, gold, silver, chromium, indium tin oxide, conductive polymers such as polystyrene sulfonate-doped poly(3,4-ethylenedioxythiophene) (PSS-PEDOT), and conducting ink/paste comprised of carbon black/graphite. The gate electrode can be prepared by vacuum evaporation, sputtering of metals or conductive metal oxides, conventional lithography and etching, chemical vapor deposition, spin coating, casting or printing, or other deposition processes. The thickness of the gate electrode ranges for example from about 10 to about 200 nanometers for metal films and from about 1 to about 10 micrometers for conductive polymers. Typical materials suitable for use as source and drain electrodes include those of the gate electrode materials such as aluminum, gold, silver, chromium, zinc, indium, conductive metal oxides such as zinc-gallium oxide, indium tin oxide, indium-antimony oxide, conducting polymers and conducting inks. Typical thicknesses of source and drain electrodes are, for example, from about 40 nanometers to about 1 micrometer, including more specific thicknesses of from about 100 to about 400 nanometers.

The semiconducting layer of the present disclosure comprises an organic semiconductor. Regarding electrical performance characteristics, the organic semiconductor usually has a conductivity in the range of $10^{-8}$ to $10^{-4}$ S/cm, preferably from $10^{-7}$ to $10^{-5}$ S/cm. Various dopants known in the art may also be added to change the conductivity. The organic semiconductor can be either a p-type or n-type semiconductor. Examples of organic semiconductors include but are not limited to acenes, such as anthracene, tetracene, pentacene, and substituted pentacenes, perylenes, fullerenes, oligothiophenes, polythiophenes and their substituted derivatives, polypyrrole, poly-p-phenylenes, poly-p-phenylvinylidenes, naphthalenedicarboxylic dianhydrides, naphthalene-bisimides, polynaphthalenes, phthalocyanines such as copper phthalocyanines or zinc phthalocyanines and their substituted derivatives.

In specific embodiments, the organic semiconductors are polythiophenes. Polythiophenes include, for example, regioregular and regiorandom poly(3-alkylthiophene)s, polythiophenes comprising substituted and unsubstituted thienylene groups, polythiophenes comprising optionally substituted thieno[3,2-b]thiophene and/or optionally substituted thieno[2,3-b]thiophene groups, polythiophenes comprising fused-ring aromatic groups, polythiophenes comprising heteroatom-containing fused-ring aromatic groups, and polythiophenes comprising non-thiophene based aromatic groups such as phenylene, fluorene, furan, and the like.

In specific embodiments, the polythiophene semiconductor has one of the following three general structures:

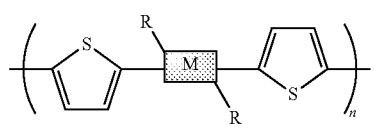

(1)

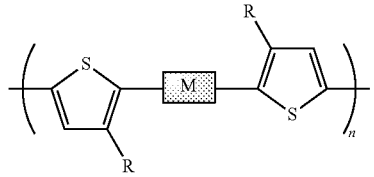

(2)

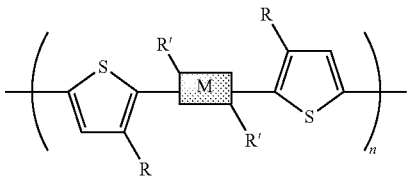

(3)

where R and R' are independently selected from hydrogen, halogen, alkyl, alkoxyalkyl, siloxyalkyl, and perfluoroalkyl; M is a divalent linkage; and n is the degree of polymerization. In specific embodiments, M is thienylene, substituted thienylene, bithiophene, terthiophene, arylene, substituted arylene, heteroarylene, or substituted heteroarylene. In more specific embodiments, M is phenylene, thienothiophene, benzothiophene, carbazole, indolocarbazole, fluorene, benzodithiophene, or bithiophene. In other specific embodiments, R and R' are selected from alkyl. In more specific embodiments, R and R' are alkyl containing from about 1 to about 25 carbon atoms, including from about 4 to about 18 carbon atoms, and further including from about 6 to about 16 carbon atoms, including isomeric forms thereof, mixtures thereof, and the like.

The semiconducting layer is from about 5 nanometers to about 1000 nanometers deep, including from about 20 to about 100 nanometers in depth. In certain configurations, such as the configurations shown in FIGS. 1 and 4, the semiconducting layer completely covers the source and drain electrodes.

The semiconducting layer can be formed by molecular beam deposition, vacuum evaporation, sublimation, spin-on coating, dip coating, printing (e.g., inkjet printing, screen printing, stencil printing, microcontact printing, flexographic printing), and other conventional processes known in the art, including those processes described in forming the gate electrode.

The various components of the OTFT may be deposited upon the substrate in any order. Generally, however, the gate electrode and the semiconducting layer should both be in contact with the gate dielectric layer. In addition, the source and drain electrodes should both be in contact with the semiconducting layer.

The following examples are for purposes of further illustrating the present disclosure. The examples are merely illustrative and are not intended to limit devices made in accordance with the disclosure to the materials, conditions, or process parameters set forth therein. All parts are percentages by volume unless otherwise indicated.

EXAMPLES

A block copolymer with a nonpolar (hydrophobic) polydimethylsilane block and a polar (hydrophilic) bisphenol-A block was used as the gate dielectric layer in a device. The contact angle of the surface of the dielectric layer was found to be 90-95 degrees, which means the surface is hydrophobic and therefore the block copolymer self-assembled into the desired state. The mobility of this device was 0.02 cm$^2$/V·sec with an on/off current of $10^5$.

As a control, a device was prepared where the gate dielectric layer was a bisphenol-A polymer (i.e. without the silane block). The control device had a mobility of 0.003 cm$^2$/V·sec with an on/off current of $10^4$.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An organic thin film transistor comprising a substrate, a semiconductor layer, and a gate dielectric layer, wherein the gate dielectric layer comprises a block copolymer, wherein the block copolymer comprises a polar block and a nonpolar block, the polar block is bisphenol-A polycarbonate, and the nonpolar block is polydimethylsilane.

2. The transistor of claim 1, wherein the gate dielectric layer is in the form of a first layer comprising a majority of the polar block of the block copolymer and a second layer comprising a majority of the nonpolar block of the block copolymer, wherein the second layer is closer to the semiconductor layer than the first layer.

3. The transistor of claim 2, wherein the first layer contains from about 60% to 100% by weight of the polar block, based on the total weight of the first layer.

4. The transistor of claim 2, wherein the second layer contains from about 60% to 100% by weight of the nonpolar block, based on the total weight of in the second layer.

5. The transistor of claim 1, wherein the gate dielectric layer is phase-separated into (i) a continuous phase comprising a majority of the nonpolar block of the block copolymer; and (ii) a discontinuous phase comprising a majority of the polar block of the block copolymer.

6. The transistor of claim 1, wherein the block copolymer is crosslinked.

7. The transistor of claim 1, wherein the gate dielectric layer further comprises inorganic nanoparticles, wherein a majority of the nanoparticles is dispersed in a phase formed from the polar block.

8. The transistor of claim 7, wherein the inorganic nanoparticles are formed in-situ in the presence of the block copolymer.

9. The transistor of claim 1, wherein the semiconducting layer comprises a polythiophene.

10. The transistor of claim 9, wherein the polythiophene has one of the three following structures:

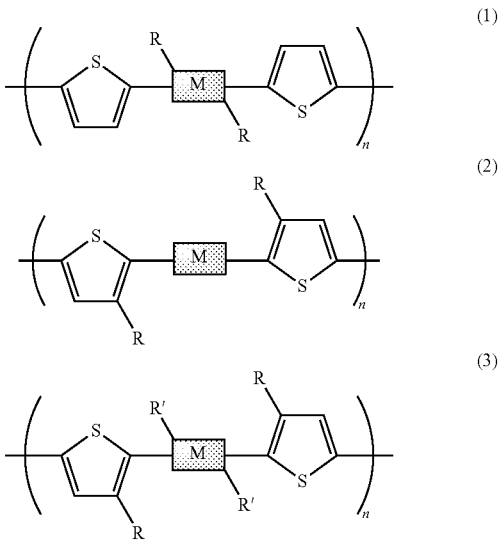

where R and R' are independently selected from hydrogen, halogen, alkyl, alkoxyalkyl, siloxyalkyl, and perfluoroalkyl; M is a divalent linkage; and n is the degree of polymerization.

11. An organic thin film transistor comprising a substrate, a semiconductor layer, and a gate dielectric layer, wherein the gate dielectric layer consists of a block copolymer, wherein the block copolymer has a polar block and a nonpolar block, the polar block is bisphenol-A polycarbonate, and the nonpolar block is polydimethylsilane.

12. An organic thin film transistor comprising a substrate, a semiconductor layer, and a gate dielectric layer, wherein the gate dielectric layer consists of inorganic nanoparticles and a block copolymer, wherein the block copolymer has a polar block and a nonpolar block, the polar block is bisphenol-A polycarbonate, and the nonpolar block is polydimethylsilane.

* * * * *